United States Patent [19]

Judge et al.

[11] 3,757,271

[45] Sept. 4, 1973

[54] INTEGRATED CIRCUIT PACKAGE

[75] Inventors: Robert Louis Judge, Poughkeepsie; Eugene Steven Pearson, Wappingers Falls, both of N.Y.

[73] Assignee: International Business Machines Corporation, Armonk, N.Y.

[22] Filed: Oct. 4, 1971

[21] Appl. No.: 185,980

[52] U.S. Cl... 339/17 CF, 317/101 CP, 339/75 MP, 339/174

[51] Int. Cl. ........................................ H05k 1/02

[58] Field of Search........... 339/17 R, 17 C, 17 CF, 339/17 M, 17 N, 18 R, 18 C, 176 MF, 176 M, 174, 75 MP, 192 M; 317/100, 101

[56] References Cited

UNITED STATES PATENTS

| | | | |
|---|---|---|---|
| 3,335,327 | 8/1967 | Damon et al. | 339/17 CF X |
| 2,905,920 | 9/1959 | Lutton | 339/17 N |
| 2,898,522 | 8/1959 | Handen | 339/17 N X |
| 3,663,920 | 5/1972 | Lapham et al. | 339/17 CF |
| 3,011,379 | 12/1961 | Corwin | 339/17 CF X |
| 3,409,857 | 11/1968 | O'Neill et al. | 339/17 CF |
| 3,340,439 | 9/1967 | Henschen et al. | 339/17 CF X |
| 3,164,750 | 1/1965 | Miller | 339/17 CF X |
| 3,026,494 | 3/1962 | Andersen et al | 339/17 CF |

FOREIGN PATENTS OR APPLICATIONS

| | | | |
|---|---|---|---|
| 1,087,861 | 10/1967 | Great Britain | 339/17 CF |

OTHER PUBLICATIONS

"Heat Dissapator Assemblies," Mandel, Melau & Tepper, IBM Technical Disclosure Bulletin, Vol. 8, No. 10, March, 1966, p. 1460.

*Primary Examiner*—Joseph H. McGlynn
*Assistant Examiner*—Terrell P. Lewis
*Attorney*—William J. Dick et al.

[57] ABSTRACT

A package for a fragile integrated circuit module having radially extending leads, the package comprising a frame split into first and second frame members, the first frame member being superimposed of the second frame member. Support pads project inwardly from the corners of one of the frame members and are recessed below the upper surface of the frame for supporting the module thereon. Resilient clamps are superimposed of the pads and connected to the frame to embrace the module intermediate the pads and the clamps. A plurality of pins depend from the frame and the leads on the module are strain relieved and connected to the pin heads which pass through one of the frame members, the frame members being connected so that the point of connection between the lead and pin is covered by the other of the frames.

5 Claims, 5 Drawing Figures

PATENTED SEP 4 1973 3,757,271

INVENTORS
ROBERT L. JUDGE
EUGENE S. PEARSON
BY William J. Dick
ATTORNEY

INTEGRATED CIRCUIT PACKAGE

SUMMARY OF THE INVENTION AND STATE OF THE PRIOR ART

The present invention relates to an integrated circuit package, and more particularly relates to a package-carrier for a fragile integrated circuit module which permits both sides of the module to be exposed.

More particularly the package-carrier of the present invention is adapted for holding integrated circuit modules having radially extending leads, the package comprising at least one frame having an opening therein, and support pads projecting inwardly into the opening and recessed below the upper surface of the frame to support the module thereon. Resilient clamp means are connected to the frame, superimposed of the support pads to embrace the module intermediate the pad and the clamps to support the module within the frame. To facilitate interconnection of the package-carrier into circuit boards or sockets, a plurality of pins depend from the frame, the leads extending outwardly from the integrated circuit being stress relieved as by a bend and connected interiorally of the frame to the pins.

Integrated circuit modules, especially fragile modules, are difficult to handle without incurring breakage. Conventional packaging techniques for retaining integrated circuit modules create difficulties in testing and marking such modules because of the inability to access the module from either side. Additionally, the carriers which are conventionally used normally require coupling to the circuit board or other media by either soldering or other bonding techniques which create problems, for example on large boards, in removing the modules without ruining the circuit board.

In view of the above it is a principal object of the present invention to provide a package-carrier for integrated circuits in which both sides of the module are exposed.

Another object of the present invention is to provide a package with inwardly projecting support pads which are integral with the body of the package.

Yet another object of the present invention is to provide a package having pin-type projections for ease of connection to and disconnection from adjacent higher packaging level boards or the like.

Still another object of the present invention is to provide a package-carrier in which an integrated circuit module may be mounted with either the leads connected to the pins in the frame of the package, being integral with the frame, to facilitate lead connection to the body of the module or to permit the module, with the leads already mounted thereon, to be quickly connected to the pins in the frame-like package.

Another object of the present invention is to provide a pluggable package for an integrated circuit module in which the package circumscribes the integrated circuit modules so that the module is encompassed substantially interiorally within the opening provided therefor so as to minimize the possibility of inadvertent breakage of the module.

Other objects and a more complete understanding of the present invention may be had by referring to the following specification and claims taken in conjunction with the accompanying drawings in which:

Figures 1, 2, 3, 4, 5:
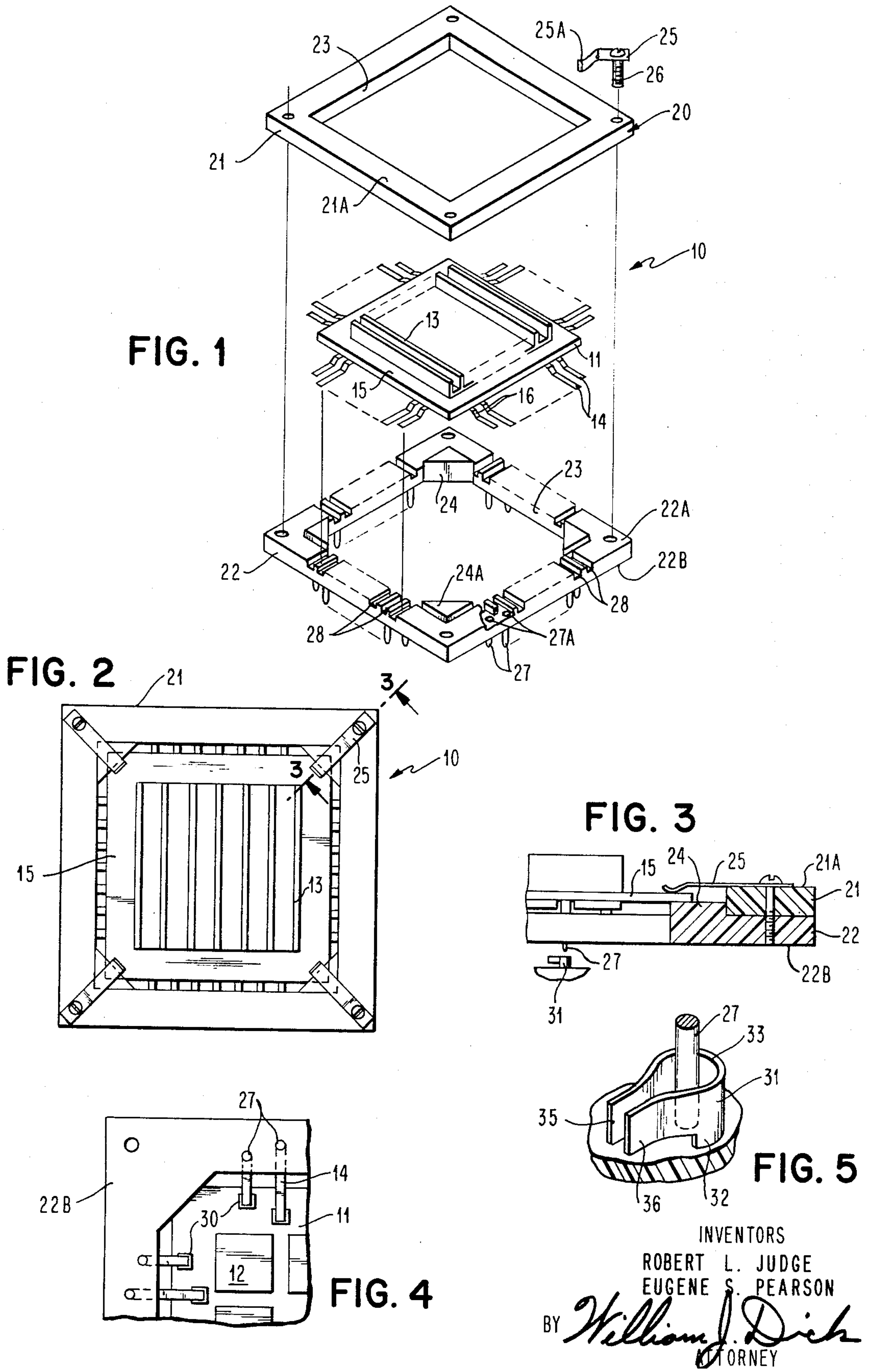
FIG. 1 is a fragmentary exploded view of the package-carrier constructed in accordance with the present invention and utilized in conjunction with an integrated circuit module.
FIG. 2 is a plan view of the package and module illustrated in FIG. 1 with the associated parts in their final position.
FIG. 3 is an enlarged fragmentary sectional view taken along line 3—3 of FIG. 2.
FIG. 4 is an enlarged fragmentary plan view of a portion of the underside of the package illustrated in FIGS. 1-3.
FIG. 5 is a fragmentary enlarged perspective view of a typical female connector which may be utilized in conjunction with the package illustrated in FIGS. 1–4.

Referring now to the drawing, and especially FIGS. 1 and 2 thereof, a package-carrier 10 constructed in accordance with the present invention is illustrated therein. As shown, the package-carrier is adapted for holding a fragile integrated circuit module, such as the silicon module 11 having a plurality of integrated circuit chips 12 mounted on the underside thereof (see FIG. 4) and a heat sink 13 mounted on the upper surface thereof. As illustrated, the module 11 has a plurality of leads 14 which extend radially from the body 15 thereof, the leads 14, for purposes which will be more fully explained hereinafter, include a strain relief bend 16 therein.

In accordance with the invention, the package-carrier encompasses the module 11, connecting the leads to plug-gable pins while permitting both sides of the module to be exposed for marking, testing, etc. To this end, the package-carrier comprises a frame 20 including an opening 23 therein, the frame being split into a first frame member 21 and a second frame member 22 which are adapted for registration in superimposed overlying engagement. The second frame member includes support pads 24 which project inwardly from the corners of the second frame into the opening 23 and are recessed below the upper surface 21A of the first frame member 21 so as to provide a recessed support for the body 15 of the module 11.

The support pads 24 are designed to hold the body 15 of the module 11 and to relieve any stress or strain on the leads 14. To this end, the support pads have an upper surface 24A which is elevated above the upper surface 22A of the second frame member. It should be recognized that the support pad material is integral with and may be formed as a part of the second frame member. Additionally, although the upper surface 24A of the support pads is raised with respect to the upper surface 22A of the frame 22, it is preferable that in the overall package configuration it is recessed with respect to the upper surface 21A of the frame 21 so that the body 15 of the module 11 is positioned within the opening 23 of the frame 20.

In order to hold the module and permit stress, if any, to be placed upon the body 15 of the module as opposed to the leads 14, resilient clamps 25 are connected as by screws 26 at the corner of the first frame member 21, the clamps including a downward body engaging portion 25A which is superimposed of the support pads to embrace the body 15 of the module 11 intermediate the pads and the clamps. Additionally, if desired, the screws 26 may serve to connect the first frame member to the second frame member.

To facilitate connection of the leads 14 to external circuitry in such a manner that the integrated circuit may be removed without damage, the second frame member 22 is provided with a plurality of pins 27 which depend from the lower surface 22B of the second frame member. The pins extend, as shown best in FIG. 1, through the body of the second frame member and terminate in a head portion 27A contained in slots or grooves 28 in the surface 22A. The slots or grooves 28 are designed to receive the leads 14 associated with the module 11, the stress relief 16 of the leads being approximately equal in height to the elevation of the surface 24A of the pads 24 from the upper surface 22A of the second frame member 22.

With the leads 14 in the grooves 28, connection of the first frame member to the second frame member will cause the leads to be pressed onto the heads of the pins 27 and a mechanical connection is thereby formed. Alternately, the leads may be bonded as by solder, sonic bonding, welding, etc. to the pin heads so that a permanent package-carrier design is obtained.

Alternatively, the frame may include leads emanating towards the opening 23 so that the body 11 of the module may be subsequently connected to the leads. For example and referring to FIG. 4, if the leads are already embedded in the frame 20 and connected to the pins 27, and the body 15 of the module 11 contains solder pads or the like 30, the body may be connected to the leads by merely turning the frame over and soldering, welding, sonic bonding or other well-known methods of attachment of the leads to the pads 30.

It should be recognized that the frame facilitates the connection of the integrated circuit module to adjacent female sockets, for example in large area boards. The frame provides a convenient package-carrier for plugging the integrated circuits into and out of such a board. Additionally, it should be recognized that the package-carrier 10 may resist breakage due to lateral forces and in this connection may be utilized with the hairpin connector illustrated in FIG. 5.

The hairpin connector 31 illustrated in FIG. 5 is fully described and disclosed in the application Ser. No. 101,662 filed Dec. 28, 1970, now U.S. Pat. No. 3,676,832 issued July 11, 1972, with the inventors being the same as in this application, that patent and the subject matter thereof, herein being incorporated by reference. Briefly, the female connector 31 is adapted to receive a pin 27 without axial stress on either the male or female connector and then, by effecting a relative lateral shift between the connectors, engagement and frictional locking of the male to the female is effected. To this end, the female connector 31 comprises an axially extending conductive body portion 32, in the present instance tubular in shape, including a receptacle 33, in the illustrated instance loop shaped, at one terminal end of the body portion 32. The receptacle includes upstanding wall means extending from the tubular body portion 32, the wall means defining an opening of greater diameter than the diameter of the pin 27 intended for use with the connector. In this manner pins may be inserted into the receptacle without frictionally engaging the wall thereof thereby permitting an essentially zero force insertion. To this end the female connector 31 includes a pair of resilient, radially projecting arms 35 and 36 which converge from the wall of the receptacle 33, defining a converging path between the receptacle and the arms. As shown, at least a portion of the arms 35 and 36 define a space therebetween having a dimension less than the diameter of the pin 27, the receptacle opening and the space being in communication. After insertion of the pins into the female connector 31 relative movement is effected between the package-carrier 10 and the connector 31,creating a wiping and self-locking action between the pin and connector.

Thus the package-carrier of the present invention provides a holder for an integrated circuit in which both sides of the integrated circuit are exposed. Additionally, the package provides means for alleviating strain on the integrated circuit leads while retaining the body of the module substantially within the opening of the frame. The above advantages are all obtained while simultaneously providing for convenient connection and disconnection to and from adjacent circuit boards.

Although the invention has been described with a certain degree of particularity, it is understood that the present disclosure has been made only by way of example and that numerous changes in the details of construction and the combination and arrangement of parts may be made without departing from the spirit and the scope of the invention as hereinafter claimed.

What is claimed is:

1. A package-carrier for an integrated circuit module of the type having radially and outwardly extending leads, said carrier comprising first and second frame members, means defining an opening in each of said members, and an upper and lower surface on each of said frame members, said first frame member being adapted for superimposed registration with said second frame member; support pads projecting inwardly into said opening and integral with said second frame member, said support pads having a module supporting surface elevated above the upper surface of said second frame member; said module supporting surface, when said frame members are in registration, being recessed relative to the upper surface of said first frame member; clamp means overlying said support pads and connected to said first frame member for embracing a module intermediate said clamp means and said support pads; means defining module lead receiving slots in at least one of said lower surface of said first frame member and upper surface of said second frame member, connectors passing through one of said frame members and into said slots, and means for connecting said first frame member to said second frame member.

2. A package-carrier in accordance with claim 1 wherein said frames are substantially rectangular and said pads extend from the corners of said second frame member.

3. A package-carrier in accordance with claim 2 wherein said clamp means are resilient.

4. A package-carrier in accordance with claim 1 wherein said connectors comprise pins having heads thereon, the heads of said pins being in said slots.

5. A package-carrier in accordance with claim 4 including an integrated circuit module in said package, said module having radially extending leads having strain relief bends in said leads whereby said module is substantially supported on said support pads and said leads of said module are positioned in said slots bearing against the heads of said pins.

* * * * *